United States Patent
Lee et al.

(10) Patent No.: US 12,249,750 B2
(45) Date of Patent: Mar. 11, 2025

(54) COMMUNICATION DEVICE WITH HEAT DISSIPATION BASE

(71) Applicant: Wistron NeWeb Corp., Hsinchu (TW)

(72) Inventors: Chien Lee, Hsinchu (TW); Hsiang-Chao Liu, Hsinchu (TW); Man-Ning Lu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 214 days.

(21) Appl. No.: 17/814,037

(22) Filed: Jul. 21, 2022

(65) Prior Publication Data
US 2023/0178871 A1    Jun. 8, 2023

(30) Foreign Application Priority Data
Dec. 7, 2021   (TW) .................................. 110145607

(51) Int. Cl.
*H01Q 1/02* (2006.01)
*H05K 7/20* (2006.01)

(52) U.S. Cl.
CPC ........... *H01Q 1/02* (2013.01); *H05K 7/20336* (2013.01)

(58) Field of Classification Search
CPC ........ H05K 7/20336; H01Q 1/02; H01Q 1/42; H01Q 1/246; H01Q 3/06
See application file for complete search history.

(56) References Cited

U.S. PATENT DOCUMENTS

| | | | | |
|---|---|---|---|---|
| 6,141,216 A | * | 10/2000 | Holung | F28D 15/0266 361/679.52 |
| 7,043,280 B1 | * | 5/2006 | Shields | H01Q 1/246 343/702 |
| 10,448,264 B2 | * | 10/2019 | Elson | H04W 24/08 |
| 10,721,842 B1 | * | 7/2020 | Fathi | H05K 7/20809 |
| 11,831,064 B2 | * | 11/2023 | Yoo | H01Q 1/246 |
| 2014/0133101 A1 | * | 5/2014 | Sunaga | H05K 1/0209 361/699 |
| 2016/0380350 A1 | | 12/2016 | Elson et al. | |
| 2023/0007808 A1 | * | 1/2023 | Lau | H01Q 1/02 |

FOREIGN PATENT DOCUMENTS

CN    101989113 A    3/2011

* cited by examiner

*Primary Examiner* — Zachary Pape
(74) *Attorney, Agent, or Firm* — McClure, Qualey & Rodack, LLP

(57) ABSTRACT

A communication device is provided. The communication device includes a heat dissipation case, a heat conductive member, a heat dissipation base, and a communication module. The heat conductive member is thermally connected to the heat dissipation case, and the heat dissipation base is pivotally connected to the heat conductive member. The heat dissipation base is thermally connected to the heat conductive member and is adapted to be rotated between a first orientation and a second orientation relative to the heat conductive member. The communication module is affixed to the heat dissipation base.

14 Claims, 8 Drawing Sheets

COMMUNICATION DEVICE WITH HEAT DISSIPATION BASE

CROSS REFERENCE TO RELATED APPLICATIONS

This application claims the benefit of priority to Taiwan Patent Application No. 110145607, filed on Dec. 7, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND OF THE INVENTION

Field of the Invention

The present disclosure relates to a communication device, and more particularly, to a communication device capable of adjustments to achieve better signal-transmission effect.

Description of the Related Art

In a communication system using the fifth generation (5G) wireless technology, there are issues such as high path loss and high transmission loss because of the shorter 5G signal wavelength, and beam forming technology has been used to address these issues. However, due to the high-directional transmission characteristic of beam forming technology, the communication module of the communication device like 5G router would need to be rotatable for adjustment in order to obtain the best communication quality.

Currently there are designs that allow the orientation of the communication module to be adjusted manually, but these communication modules are usually in an exposed state. Since communication devices like 5G routers are often installed outside of buildings, an exposed communication module would suffer contamination by dust and moisture when being in the outdoor environment for a long time, and thereby affecting its lifespan and reliability.

BRIEF SUMMARY OF THE INVENTION

It is an object of the present disclosure to provide a communication device for solving the aforementioned issues. The communication device includes a heat dissipation case, a heat conductive member, a heat dissipation base, and a communication module. The heat conductive member is thermally connected to the heat dissipation case. The heat dissipation base is pivotally connected and thermally connected to the heat conductive member and is adapted to rotate relative to the heat conductive member between a first orientation and a second orientation. The communication module is affixed to the heat dissipation base.

In the communication device provided by the present disclosure, the heat conductive member, the heat dissipation base, and the communication module are shielded by the external cover and the heat dissipation case. Thus, in a situation where the communication device is installed outdoors, the external cover and the heat dissipation case provide good waterproof and dustproof protections and thereby improving the lifespan and reliability of the communication device. Moreover, heat generated by the communication module is fully transferred to the heat dissipation case through the heat dissipation base and the heat conductive member, and is further dissipated by the heat dissipation case. Hence, the communication device has good heat dissipation capability. The communication module of the present disclosure is thermally connected to the heat conductive member via the heat dissipation base and is adapted to rotate relative to the heat conductive member, and so design requirements such as signal adjustment and heat dissipation can be met at the same time.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
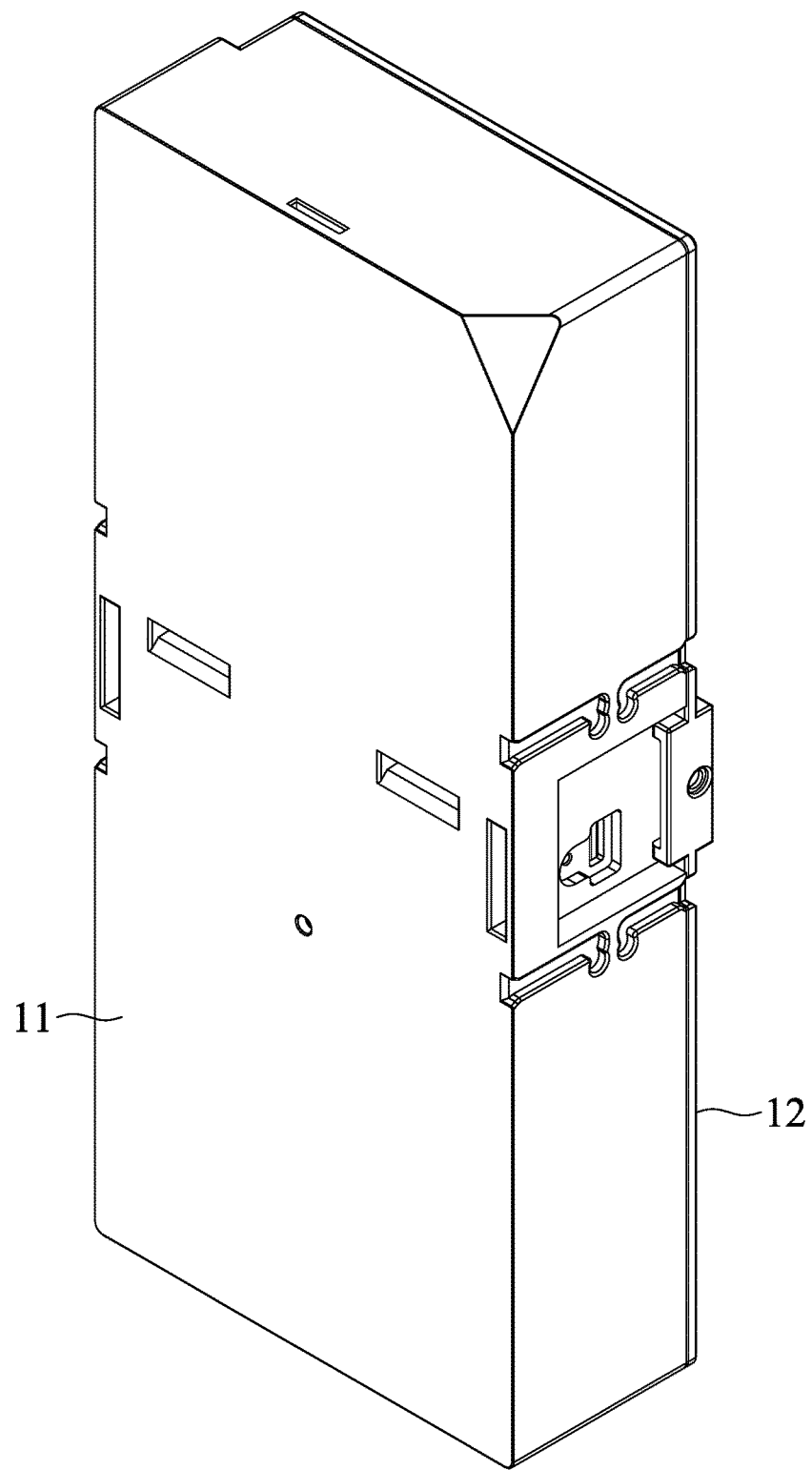
FIG. 1 is a schematic perspective view of a communication device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way.

Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
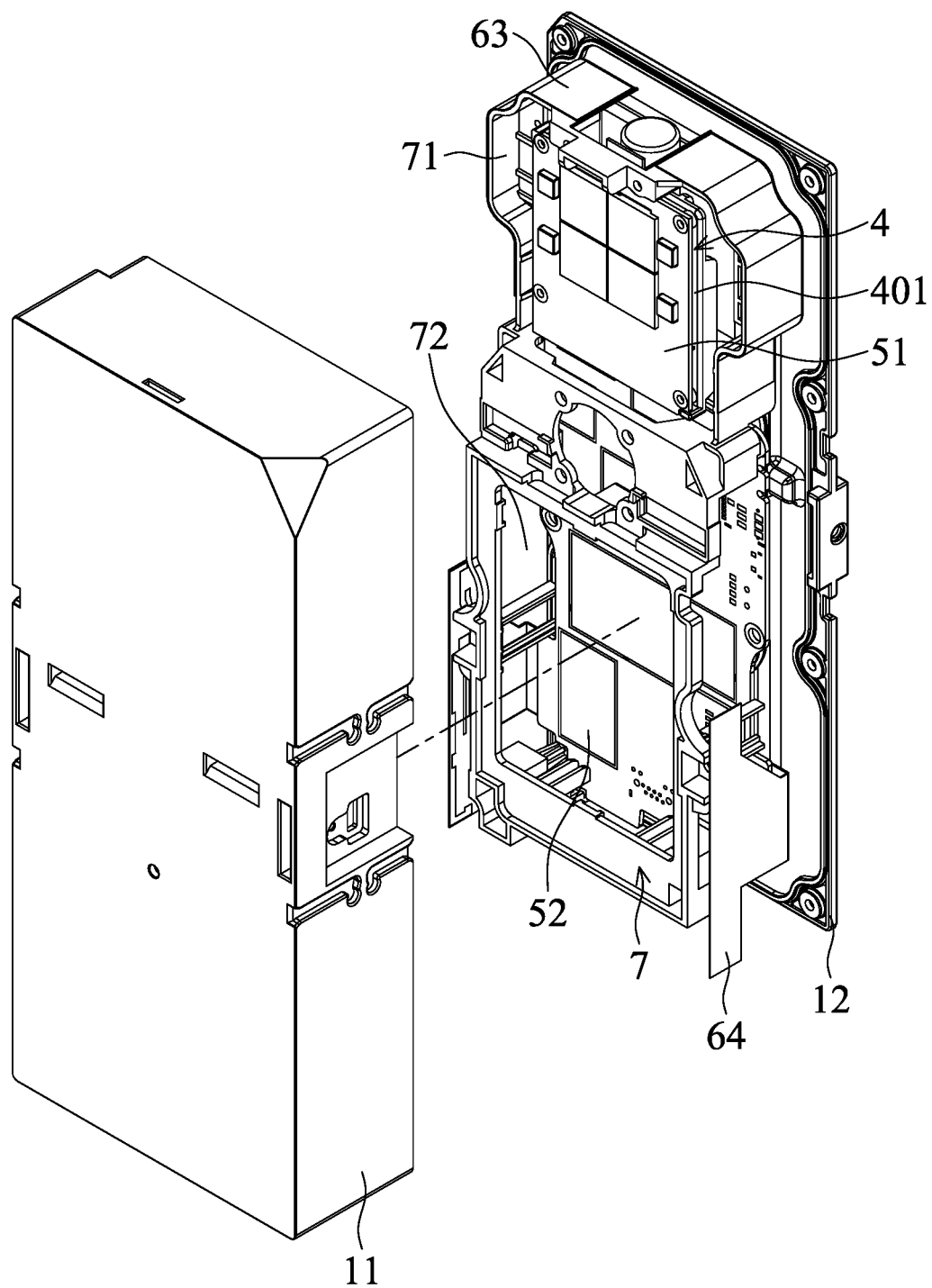
FIG. 2 illustrates partial internal structure of a communication device according to an embodiment of the present disclosure.
Figure 3:
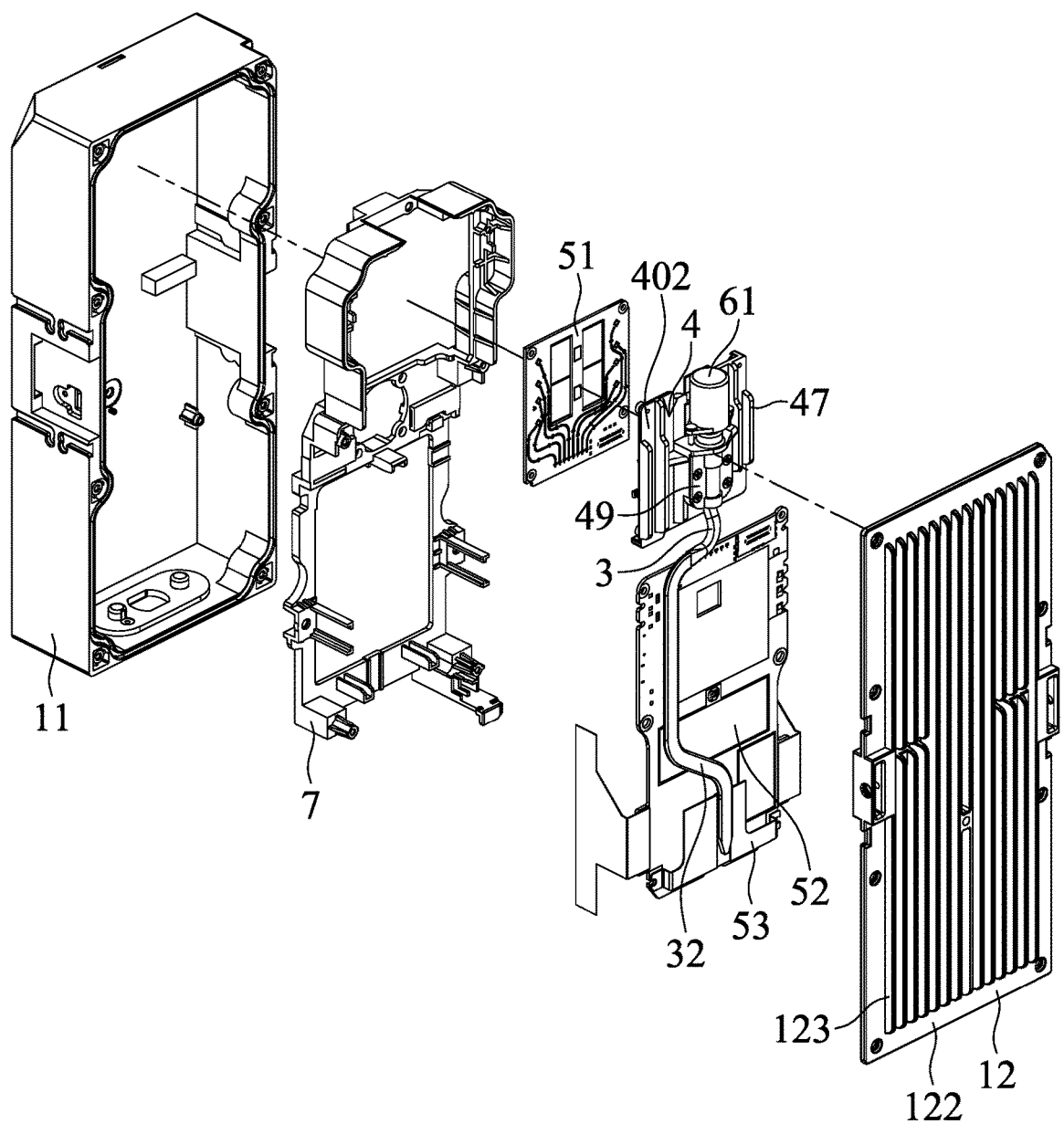
FIG. 3 is a schematic exploded view illustrating partial elements of a communication device according to an embodiment of the present disclosure.

Referring to FIG. 1 to FIG. 3, a communication device C includes an external cover 11, a heat dissipation case 12, a heat conductive member 3, a heat dissipation base 4, and a communication module 51. The heat conductive member 3 is thermally connected to the heat dissipation case 12. The heat dissipation base 4 is pivotally connected as well as thermally connected to the heat conductive member 3. The heat dissipation base 4 is adapted to rotate between a first orientation and a second orientation relative to the heat conductive member 3. The communication module 51 is fixedly connected to the heat dissipation base 4. The external cover 11 is connected to the heat dissipation case 12, and the heat conductive member 3, the heat dissipation base 4, and the communication module 51 which are placed in between the external cover 11 and the heat dissipation case 12 are thereby shielded and covered by the external cover 11 and the heat dissipation case 12.

In one embodiment, the heat dissipation case is made of material such as aluminum or other heat conductive metal, but the present disclosure is not limited thereby.

Figure 4:
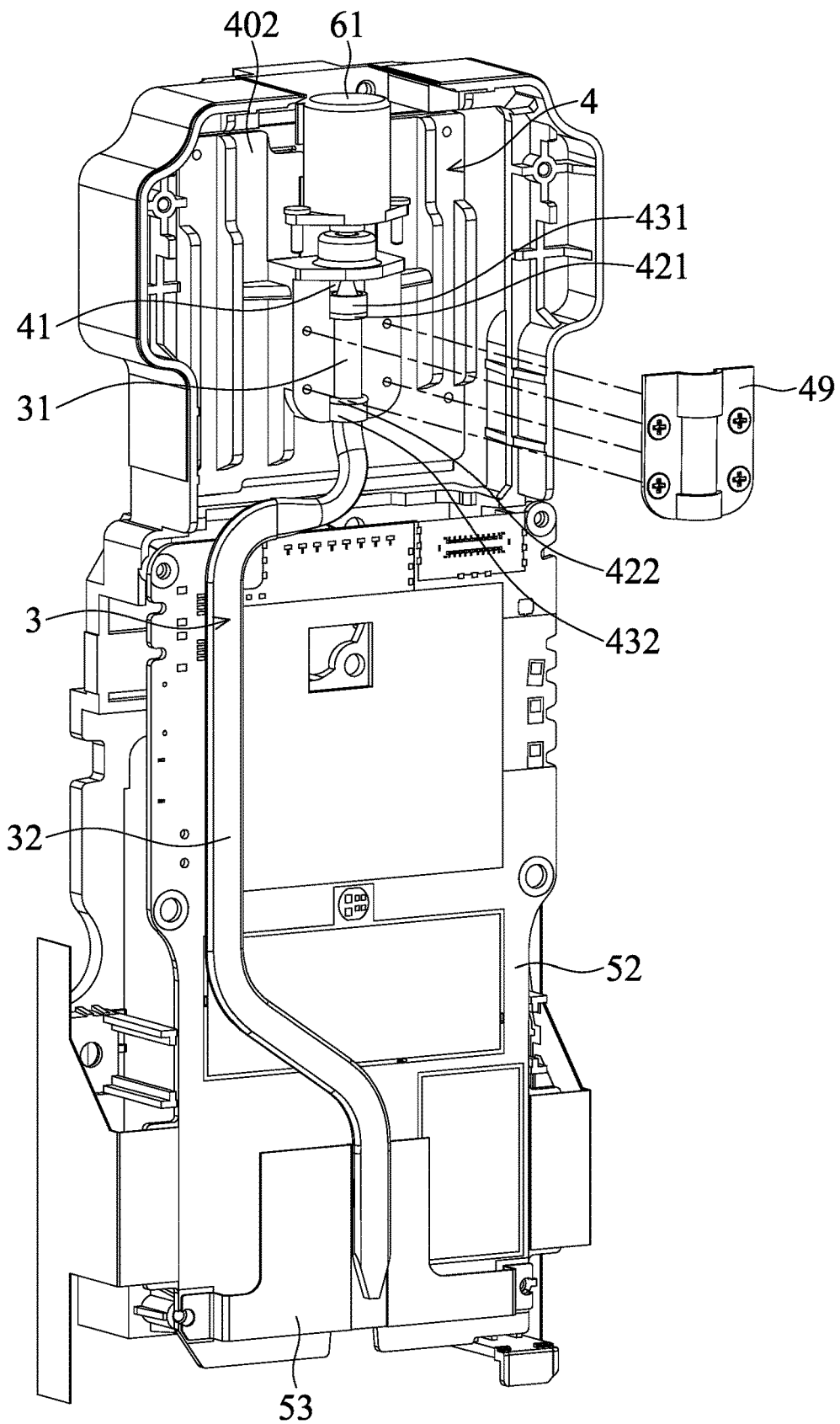
FIG. 4 is illustrates detailed structure of a heat dissipation base according to an embodiment of the present disclosure.

Referring to FIG. 2 and FIG. 4, in one embodiment, the heat dissipation base 4 includes a first base surface 401, a second base surface 402, and a pivot slot 41. The first base surface 401 and the second base surface 402 are on opposite and reverse sides of the heat dissipation base 4. The communication module 51 is disposed on the first base surface 401, and the pivot slot 41 is formed on the second base surface 402. The heat conductive member 3 includes a connecting rod 31, and at least a part of the connecting rod 31 is disposed in the pivot slot 41.

Referring to FIG. 3 and FIG. 4, in one embodiment, the communication device C further includes a restricting lid 49. The restricting lid 49 is fixedly connected to the heat dissipation base 4 to cover the pivot slot 41 and to restrict the connecting rod 31 to stay within the pivot slot 41.

Referring to FIG. 3 and FIG. 4, in one embodiment, the communication device C further includes a heat conductive material (not illustrated), a first O-ring 421, a second O-ring 422, a first sealing member 431, and a second sealing member 432. The first O-ring 421, the second O-ring 422, the first sealing member 431, and the second sealing member 432 are sleeved over the connecting rod 31. The first O-ring 421 and the first sealing member 431 are disposed at one end of the pivot slot 41, and the second O-ring 422 and the second sealing member 432 are disposed at another end of the pivot slot 41. The inside of the pivot slot 41 is filled with the heat conductive material (not illustrated), where the heat conductive material (not illustrated) is located between the first sealing member 431 and the second sealing member 432.

In one embodiment, the O-ring and the sealing member can be replaced by ball bearing, but the present disclosure is not limited thereby.

Figure 5:
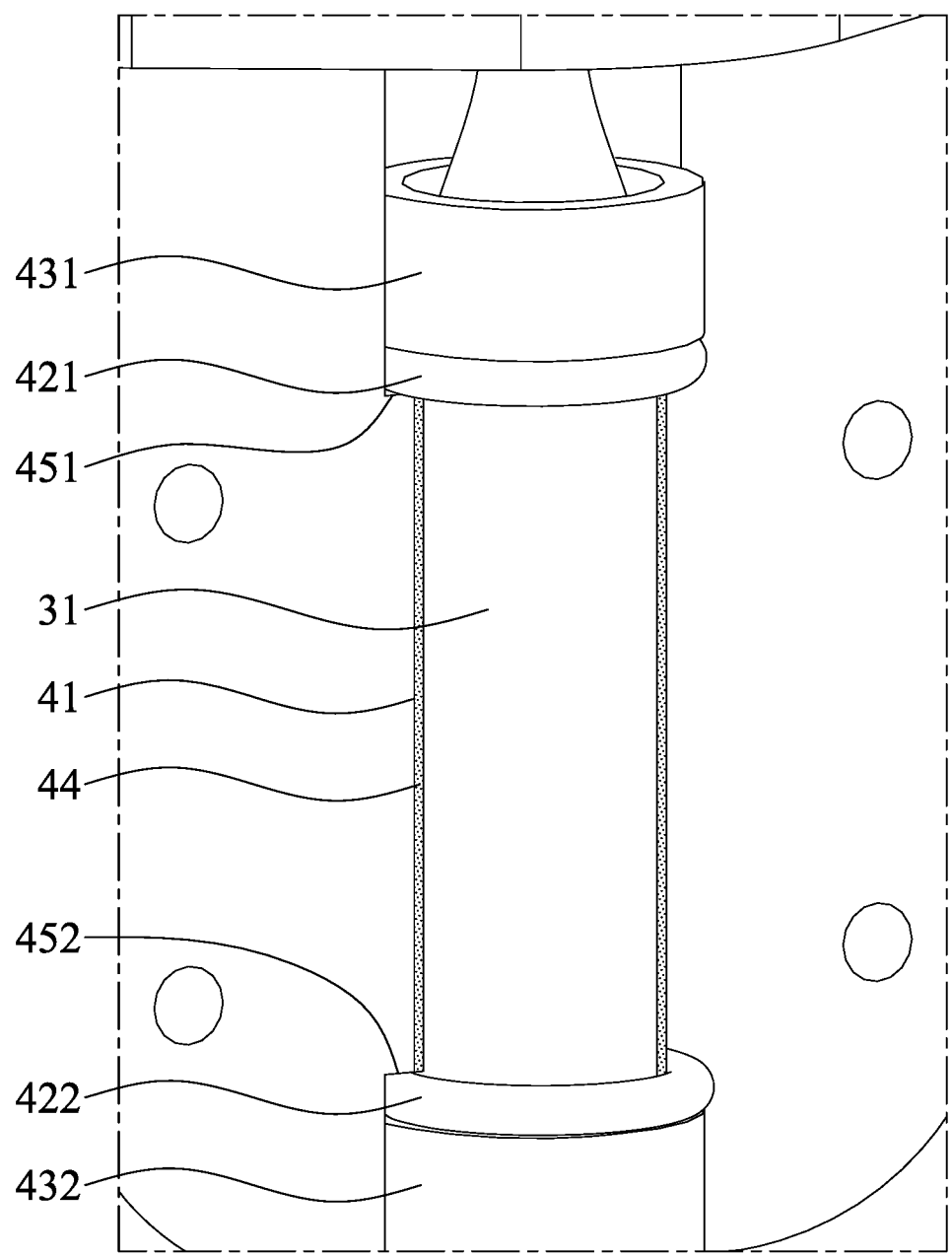
FIG. 5 illustrates a heat conductive material according to an embodiment of the present disclosure.

Referring to FIG. 5, the heat conductive material 44 is a soft material, like thermal paste, and is place inside of the pivot slot 41 and surrounding the connecting rod 31, so as to provide heat conductive function. The first O-ring 421, the second O-ring 422, the first sealing member 431, and the second sealing member 432 provide a sealing effect to prevent the heat conductive material 44 from overflowing and spilling out.

Referring to FIG. 5, in one embodiment, the heat dissipation base 4 includes a first abutting portion 451 and a second abutting portion 452. The first abutting portion 451 abuts to the first O-ring 421, and the second abutting portion 452 abuts to the second O-ring 422.

Figure 6A:
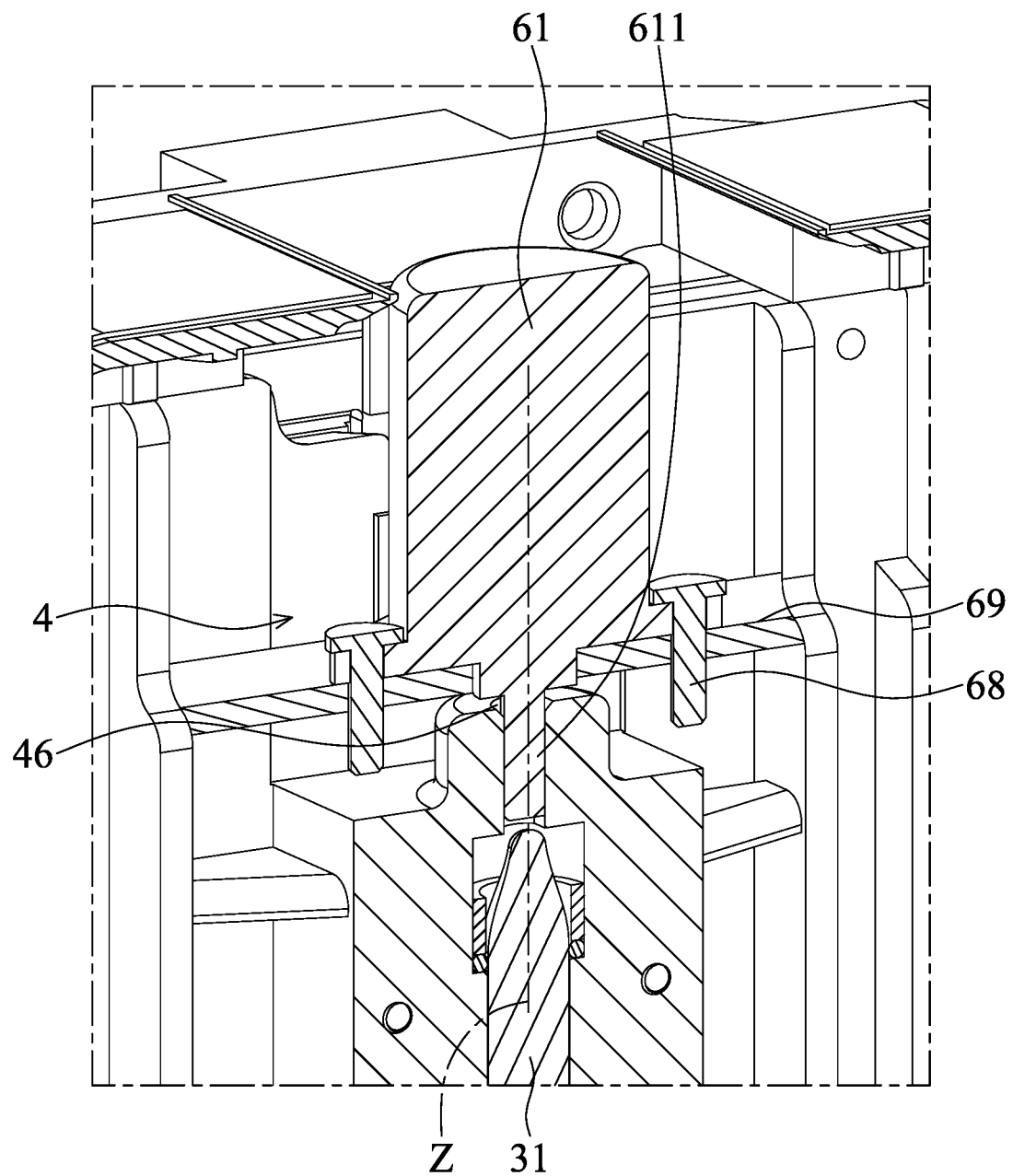
FIG. 6A illustrates an electric motor according to an embodiment of the present disclosure.
Figure 6B:
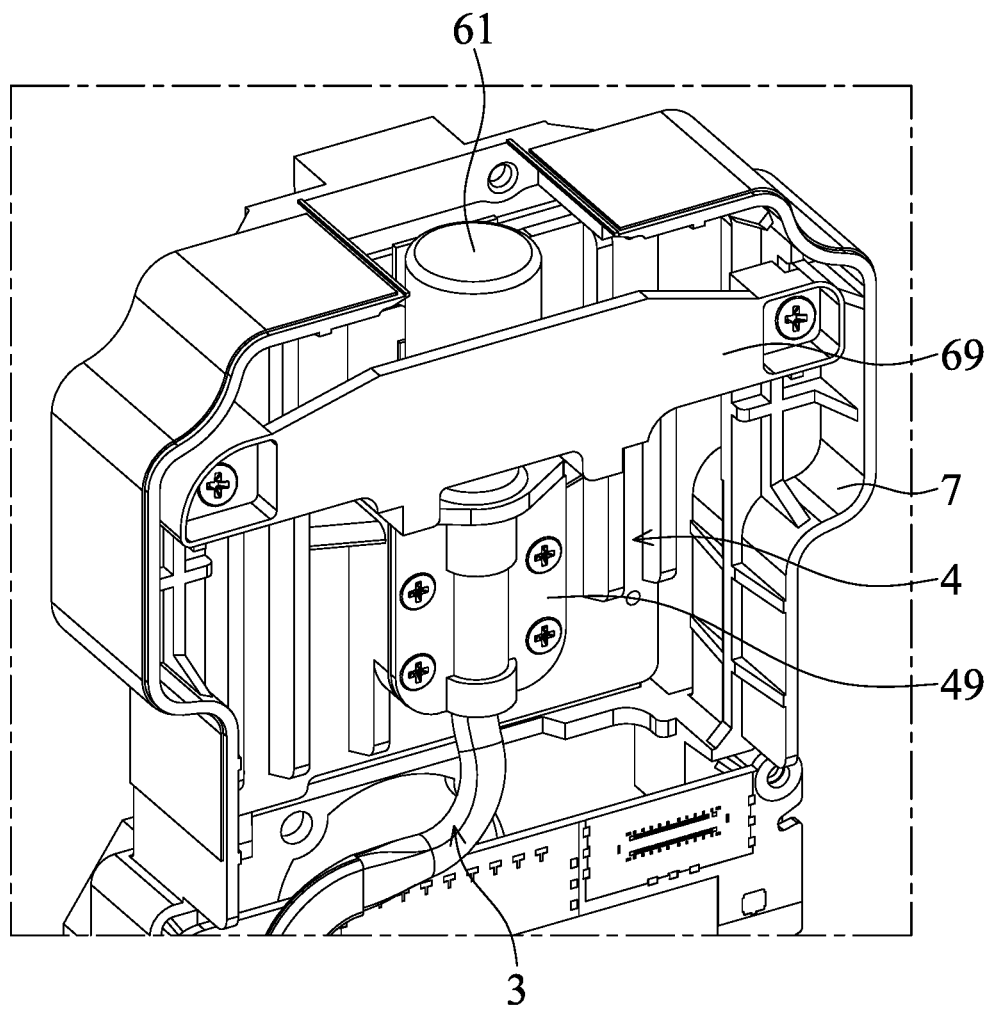
FIG. 6B illustrates a motor mounting bracket according to an embodiment of the present disclosure.

Referring to FIG. 6A, in one embodiment, the communication device further includes an electric motor 61 with a rotating shaft 611. The heat dissipation base 4 includes a connecting slot 46, and the rotating shaft 611 is inserted into and fixedly connected to the connecting slot 46. The rotating shaft 611 and the connecting rod 31 are located on the same axis Z. In one embodiment, the rotating shaft 611 is affixed to the connecting slot 46 through adhesive material. Therefore, the electric motor 61 drives the heat dissipation base 4 to rotate. Referring to FIG. 6A and FIG. 6B, in one embodiment, the electric motor 61 is fastened and fixed to a motor mounting bracket 69 through screws 68, and the motor mounting bracket 69 is fastened and fixed to a frame 7 through screws. Hence, the electric motor 61 is fixed and is able to rotate the heat dissipation base 4, such that the heat dissipation base 4 rotates relative to the frame 7.

In the embodiment of the present disclosure, the electric motor drives the heat dissipation base to rotate and thereby adjusting the orientation of the communication module to improve signal transmission strength. In one embodiment, the communication device may be equipped with a computation software and a processor which controls the rotation of the electric motor for automatically adjusting the transmission strength and efficiency of the communication module to the maximum. In another embodiment, the electric motor may be omitted and the user manually adjusts the orientation of the communication module. The above disclosure does not limit the present invention.

Referring to FIG. 3, in one embodiment, the heat dissipation base 4 includes a plurality of first cooling fins 47. The plurality of first cooling fins 47 are formed on the second base surface 402.

Figure 7:
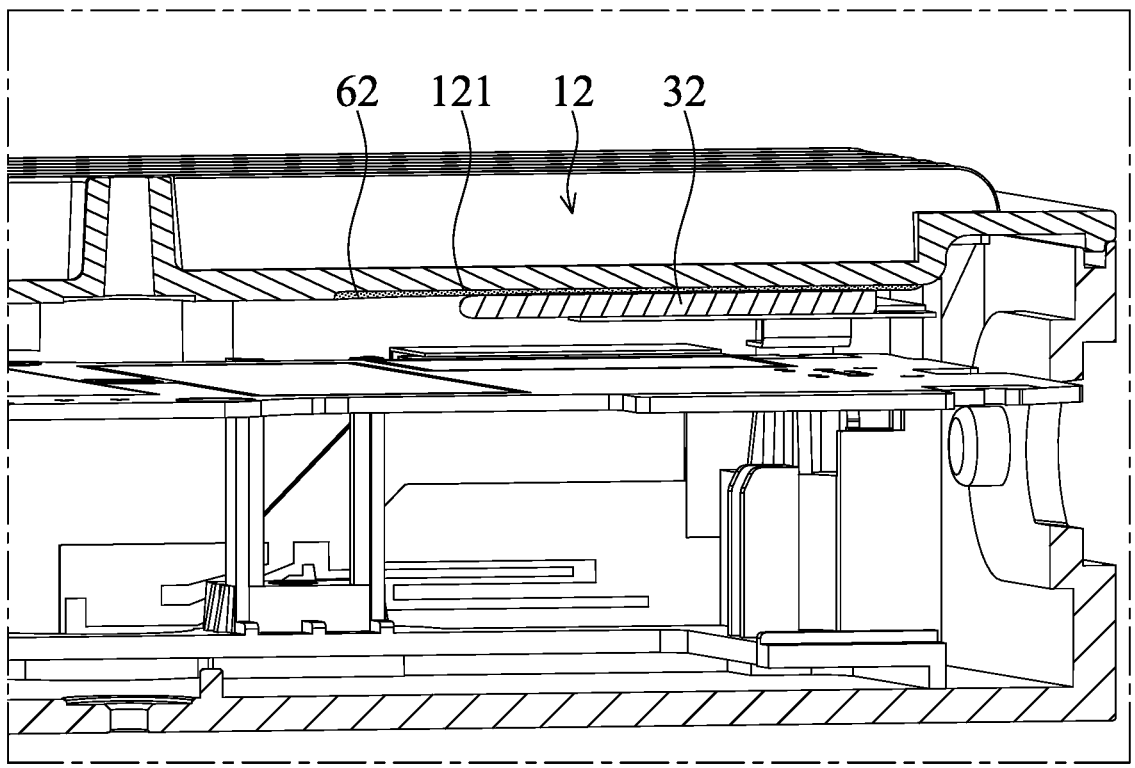
FIG. 7 illustrates a heat conductive pad according to an embodiment of the present disclosure.

Referring to FIG. 4 and FIG. 7, in one embodiment, the communication device further includes a heat conductive pad 62. The heat conductive member 3 includes a heat pipe 32. The heat conductive pad 62 is disposed on an inner surface 121 of the heat dissipation case 12, and the heat pipe 32 of the heat conductive member 3 is in contact with the heat conductive pad 62.

Referring to FIG. 3, in one embodiment, the heat dissipation case 12 includes a plurality of second cooling fins 123. The plurality of second cooling fins 123 are formed on an outer surface 122 of the heat dissipation case 12, and the outer surface 122 and the inner surface 121 are on opposite and reverse sides of the heat dissipative case 12.

Referring to FIG. 2 to FIG. 4, in one embodiment, the communication device C further includes a circuit board 52, a restricting board 53, and the frame 7. The circuit board 52 is fixed to the frame 7, and the restricting board 53 is fixed to the circuit board 52 and pushes against the heat conductive member 3 so that the heat conductive member 3 is in full contact with the heat conductive pad. The frame 7 is fixedly connected to the external cover 11 or the heat dissipation case 12, but the present disclosure is not limited thereby.

Referring to FIG. 2, in one embodiment, the frame 7 defines a first accommodation space 71 and a second accommodation space 72. The heat dissipation base 4 and the communication module 51 are disposed in the first accommodation space 71, and the circuit board 52 corresponds to the second accommodation space 72.

Referring to FIG. 2, in one embodiment, the communication device C further includes a plurality of first antennas 63. The plurality of first antennas 63 are disposed on the frame 7 and corresponds to the first accommodation space 71.

In one embodiment, the communication device further includes a plurality of second antennas 64. The plurality of second antennas 64 are disposed on the frame 7 and corresponds to the second accommodation space 72. In one embodiment, the transmission frequencies of the plurality of first antennas 63 and the plurality of second antennas 64 are different from the transmission frequency of the communication module. For example, the communication module is used to transmit 5G signals such as millimeter wave (mm Wave) signals and sub 6 signals, and the plurality of first antennas 63 and the plurality of second antennas 64 are used to transmit 4G signals such as LTE signals, but the present disclosure is not limited thereto.

In the communication device of the present disclosure, the heat conductive member, the heat dissipation base, and the communication module are shielded by the external cover and the heat dissipation case. Therefore, when the communication device is installed in an outdoor environment, the external cover and the heat dissipation case provide good waterproof and dustproof protection, and thereby enhancing the lifespan and reliability of the communication device. In addition, the heat generated by the communication module is fully transferred to the heat dissipation case through the heat dissipation base and the heat conductive member and is further dissipated by the heat dissipation case, and so the heat dissipation effect is good. Through the heat dissipation base being thermally connected to the heat conductive member and rotatable relative to the heat conductive member, the communication module of the present disclosure meets both the signal adjustment and heat dissipation design criteria.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A communication device comprising:
a heat dissipation case;
a heat conductive member, thermally connected to the heat dissipation case;
a heat dissipation base, pivotally connected to the heat conductive member, wherein the heat dissipation base is thermally connected to the heat conductive member and is adapted to be rotated between a first orientation and a second orientation relative to the heat conductive member; and
a communication module, affixed to the heat dissipation base, wherein the heat dissipation base comprises a first base surface, a second base surface, and a pivot slot, the first base surface and the second base surface are on opposite sides of the heat dissipation base, the communication module is disposed on the first base surface, the pivot slot is formed on the second base surface, the heat conductive member comprises a connecting rod, and the connecting rod is at least partially disposed in the pivot slot.

2. The communication device according to claim 1, further comprising a restricting lid affixed to the heat dissipation base to cover the pivot slot and restricting the connecting rod to the pivot slot.

3. The communication device according to claim 2, further comprising a heat conductive material, a first O-ring, a second O-ring, a first sealing member, and a second sealing member, wherein the first O-ring, the second O-ring, the first sealing member, and the second sealing member are sleeved over the connecting rod, the first O-ring and the first sealing member are disposed at one end of the pivot slot, the second O-ring and the second sealing member are disposed at another end of the pivot slot, and the heat conductive material is placed in the pivot slot in between the first sealing member and the second sealing member.

4. The communication device according to claim 3, wherein the heat dissipation base comprises a first abutting portion and a second abutting portion, the first abutting portion abuts the first O-ring, and the second abutting portion abuts the second O-ring.

5. The communication device according to claim 1, further comprising an electric motor, wherein the heat dissipation base comprises a connecting slot, the electric motor comprises a rotating shaft, the rotating shaft is inserted into and affixed to the connecting slot, and the rotating shaft and the connecting rod are located on a same axis.

6. The communication device according to claim 1, wherein the heat dissipation base comprises a plurality of first cooling fins formed on the second base surface.

7. The communication device according to claim 1, further comprising a heat conductive pad disposed on an inner surface of the heat dissipation case and in contact with the heat conductive member.

8. The communication device according to claim 7, wherein the heat dissipation case comprises a plurality of second cooling fins formed on an outer surface of the heat dissipation case, wherein the outer surface and the inner surface are on opposite sides of the heat dissipation case.

9. The communication device according to claim 7, further comprising a circuit board, a restricting board, and a frame, wherein the circuit board is fixed to the frame, the restricting board is fixed to the circuit board, and the restricting board pushes against the heat conductive member to make the heat conductive member in full contact with the heat conductive pad.

10. The communication device according to claim 9, wherein the frame defines a first accommodation space and a second accommodation space, the heat dissipation base and the communication module are disposed in the first accommodation space, and the circuit board corresponds to the second accommodation space.

11. The communication device according to claim 10, further comprising a plurality of first antennas disposed on the frame and corresponding to the first accommodation space.

12. The communication device according to claim 11, further comprising a plurality of second antennas disposed on the frame and corresponding to the second accommodation space.

13. The communication device according to claim 1, wherein the heat conductive member comprises a heat pipe, and the communication module comprises a millimeter wave array antenna module.

14. The communication device according to claim 1, further comprising an external cover connected to the heat dissipation case, wherein the heat conductive member, the heat dissipation base, and the communication module are shielded in between the external cover and the heat dissipation case.

* * * * *